(12) United States Patent
Han

(10) Patent No.: US 6,849,514 B2
(45) Date of Patent: Feb. 1, 2005

(54) METHOD OF MANUFACTURING SONOS FLASH MEMORY DEVICE

(75) Inventor: Chang Hun Han, Icheon-si (KR)

(73) Assignee: Donghu Electronics Co., Ltd., Seoul (KR)

(*) Notice: Subject to any disclaimer, the term of this patent is extended or adjusted under 35 U.S.C. 154(b) by 0 days.

(21) Appl. No.: 10/751,190

(22) Filed: Dec. 30, 2003

(65) Prior Publication Data

US 2004/0157434 A1 Aug. 12, 2004

(30) Foreign Application Priority Data

Dec. 30, 2002 (KR) .............................. 10-2002-0087292

(51) Int. Cl.[7] .............................................. H01L 21/336
(52) U.S. Cl. ...................... 438/287; 438/666; 438/257; 438/262; 438/266; 438/279
(58) Field of Search ................................ 438/287, 585, 438/669, 677, 288, 266, 594, 279, 257–265

(56) References Cited

U.S. PATENT DOCUMENTS

| | | | |
|---|---|---|---|
| 5,087,583 A | | 2/1992 | Hazani |
| 6,103,563 A | | 8/2000 | Lukanc et al. |
| 6,218,224 B1 | | 4/2001 | Lukanc et al. |
| 6,342,451 B1 | * | 1/2002 | Ahn ........................... 438/706 |
| 6,596,609 B2 | | 7/2003 | Cheng et al. |
| 2004/0127062 A1 | * | 7/2004 | Kim ........................... 438/761 |

FOREIGN PATENT DOCUMENTS

JP       10-270692 A      9/1998

OTHER PUBLICATIONS

Abstract of Korean Patent Publication KR2002001247A, Jung et al., Jan. 9, 2002.*

* cited by examiner

*Primary Examiner*—Matthew Smith
*Assistant Examiner*—Igwe U. Anya
(74) *Attorney, Agent, or Firm*—Andrew D. Fortney

(57) ABSTRACT

A method of manufacturing a SONOS flash memory device is disclosed. The disclosed method comprises the steps of forming a lower oxide layer, a tunnel nitride layer, a sacrificial oxide layer, and an insulating layer for a hard mask in sequence on a semiconductor substrate; removing a portion of the insulating layer by an etching process; forming spacers on sidewalls of the insulating layer etched; removing some part of the sacrificial oxide layer and the tunnel nitride layer by an etching process using the insulating layer and the spacers as a mask; removing the insulating layer, the spacers, and the sacrificial oxide layer; removing a portion of the lower oxide layer by an etching process using the tunnel nitride layer etched as a mask; depositing an upper oxide layer and a polysilicon layer in sequence over the resulting structure; and forming a gate having two separate tunnel nitride layer parts by removing some parts of the polysilicon layer, the upper oxide layer, and the tunnel nitride layer in sequence by an etching process. By separating the tunnel nitride layer into two parts, movement of electrons captured in the tunnel nitride layer can be completely prevented. Therefore, the present invention can obviate device malfunction, thereby ensuring device characteristics and reliability.

5 Claims, 5 Drawing Sheets

METHOD OF MANUFACTURING SONOS FLASH MEMORY DEVICE

BACKGROUND OF THE INVENTION

1. Field of the Invention

The present invention relates to a method of manufacturing a non-volatile memory device and, more particularly, to a method of manufacturing a silicon-oxide-nitride-oxide-semiconductor (SONOS) flash memory device.

2. Background of the Related Art

With the development of high-capacity memory devices, non-volatile memory devices are being increasingly important. An example of the non-volatile memory device is a flash memory device. A conventional flash memory device is a single type in which a gate structure is formed in a single cell. As shown in FIG. 1, the conventional flash memory device can indicate two states, i.e., state "1" and state "0".

However, the single type flash memory device cannot satisfy requirements for high-integration although it is a good device in itself. Thus, a multi bit cell, which has at least two gate structures in a single cell, has been developed. In addition, to embody the multi bit cell, a silicon-oxide-nitride-oxide-semiconductor (SONOS) structure has been proposed.

A flash memory device employing the SONOS structure is a kind of transistor and comprises an oxide-nitride-oxide (ONO) layer, as a non-volatile insulating material, formed on a substrate, a silicon gate formed on the ONO layer, and a source/drain region formed at both sides of the gate. As shown in FIG. 2, the SONOS flash memory device can control turn-on current capacity of a transistor, based on where electrons are injected, and, as shown in FIG. 3, indicate four states, i.e., state "11", state "10", state "01", and state "00". Therefore, the SONOS flash memory device can satisfy more or less the most recent requirement for high-integration.

A conventional SONOS flash memory device is described in detail. FIG. 4 illustrates, in a top view, a cell array of a conventional SONOS flash memory device. FIG. 5 is a cross-sectional view of FIG. 4 taken along the line A–A' and FIG. 6 is a cross-sectional view of FIG. 4 taken along the line B–B'. In FIGS. 4 through 6, "40" is a semiconductor substrate, "42" is a device isolation layer, "43" and "45" are oxide layers, "44" is a nitride layer, and "46" is a gate. As shown in FIGS. 4 through 6, a cell has a symmetrical structure and a source region and a drain region are respectively placed at both sides of the gate.

The SONOS flash memory device, like general non-volatile memory devices, provides three operations, that is, read, program, and erase. In program operation, if an appropriate program voltage is applied to the flash memory device, hot electrons are generated and captured by tunneling in a tunnel nitride layer adjacent to a drain. Therefore, a threshold voltage of a transistor increases and data programming is performed. In erase operation, if an appropriate erase voltage is applied to the flash memory device while a gate, a source, and a drain are open, the hot electrons captured in the tunnel nitride layer are forced out from the substrate. Therefore, a threshold voltage of the transistor is lowered and data erasing is performed. In read operation, if an appropriate read voltage is applied to the flash memory device, data reading is performed when a sensing circuit senses an electric current flowing between the source and the drain.

However, in the conventional SONOS flash memory device, the nitride layer cannot completely prevent the electrons from traveling therein although the nitride layer is an insulator, thereby causing cell malfunction because electrons captured in one side of the tunnel nitride layer travel to another side. Accordingly, the conventional SONOS flash memory device cannot ensure device characteristics and reliability because of the electron movement in the tunnel nitride layer.

SUMMARY OF THE INVENTION

Accordingly, the present invention is directed to a method of manufacturing a SONOS flash memory device that substantially obviates one or more problems due to limitations and disadvantages of the related art.

An object of the present invention is to provide a method of manufacturing a SONOS flash memory device that can prevent electrons captured in a tunnel nitride layer from traveling therein.

Another object of the present invention is to provide a method of manufacturing a SONOS flash memory device that can ensure device characteristics and reliability by preventing movement of electrons captured.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the present invention provides a method of manufacturing a SONOS flash memory device comprising the steps of:

forming a lower oxide layer, a tunnel nitride layer, a sacrificial oxide layer, and an insulating layer for a hard mask in sequence on a semiconductor substrate having device isolation layers;

removing a portion of the insulating layer for a hard mask by an etching process to expose a portion of the sacrificial oxide layer;

forming spacers on sidewalls of the insulating layer etched;

removing some part of the sacrificial oxide layer and the tunnel nitride layer by an etching process using the insulating layer and the spacers as a mask to expose a portion of the lower oxide layer;

removing the insulating layer, the spacers, and the sacrificial oxide layer;

removing a portion of the lower oxide layer by an etching process using the tunnel nitride layer etched as a mask to expose a portion of the substrate;

depositing an upper oxide layer and a polysilicon layer in sequence over the resulting structure; and forming a gate having two separate tunnel nitride layer parts by removing some parts of the polysilicon layer, the upper oxide layer, and the tunnel nitride layer in sequence by an etching process.

Here, the insulating layer for a hard mask is oxide or nitride formed using tetraethyl orthosilicate (TEOS) as a source. The spacers are oxide or nitride formed using TEOS as a source. A space between the two spacers is preferably between 0.020 µm and 0.5 µm. A space between the two separate tunnel nitride layer parts can be adjusted with the space between the two spacers.

By separating the tunnel nitride layer, the present invention can obviate device malfunction and, therefore, secure device characteristics and reliability.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
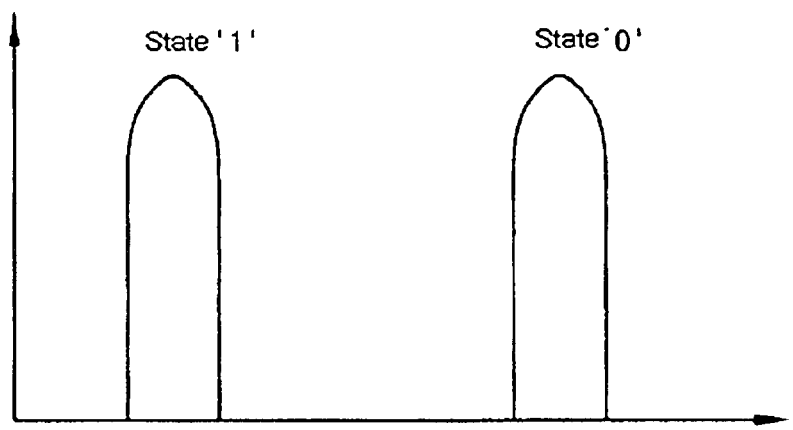
FIG. 1 is a graph illustrating states indicated by a conventional single type flash memory device.
Figure 2:
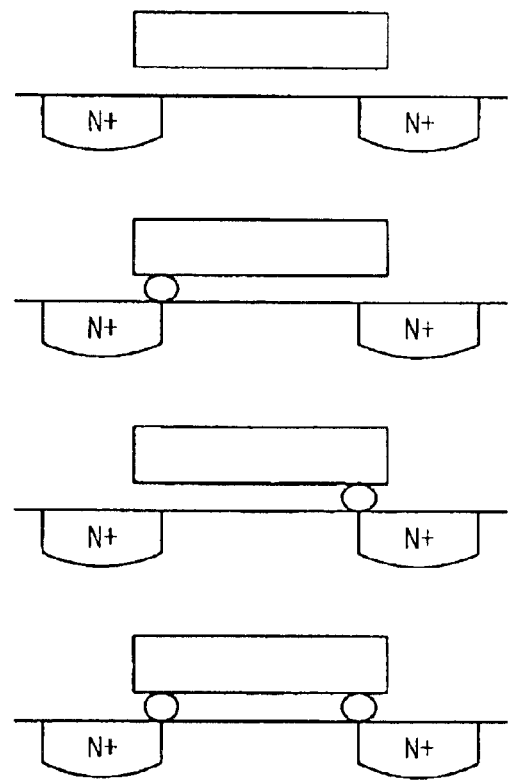
FIG. 2 is a device structure chart describing states indicated by a conventional SONOS flash memory device.
Figure 3:
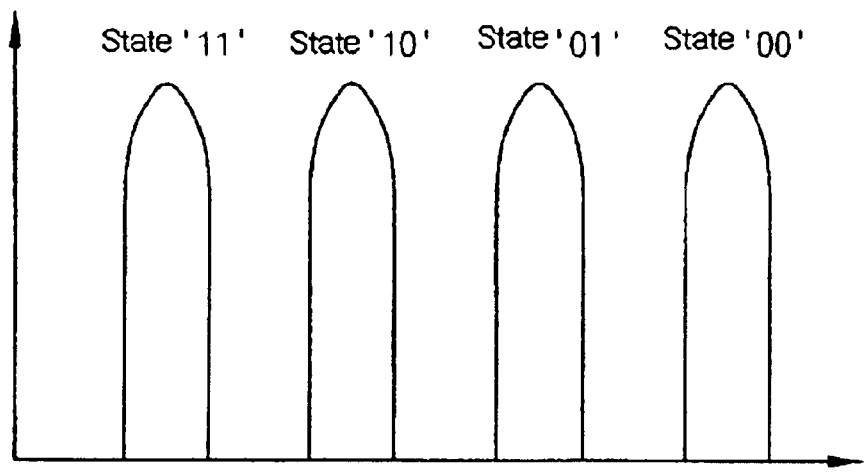
FIG. 3 is a graph illustrating states indicated by the conventional SONOS flash memory device.
Figure 4:
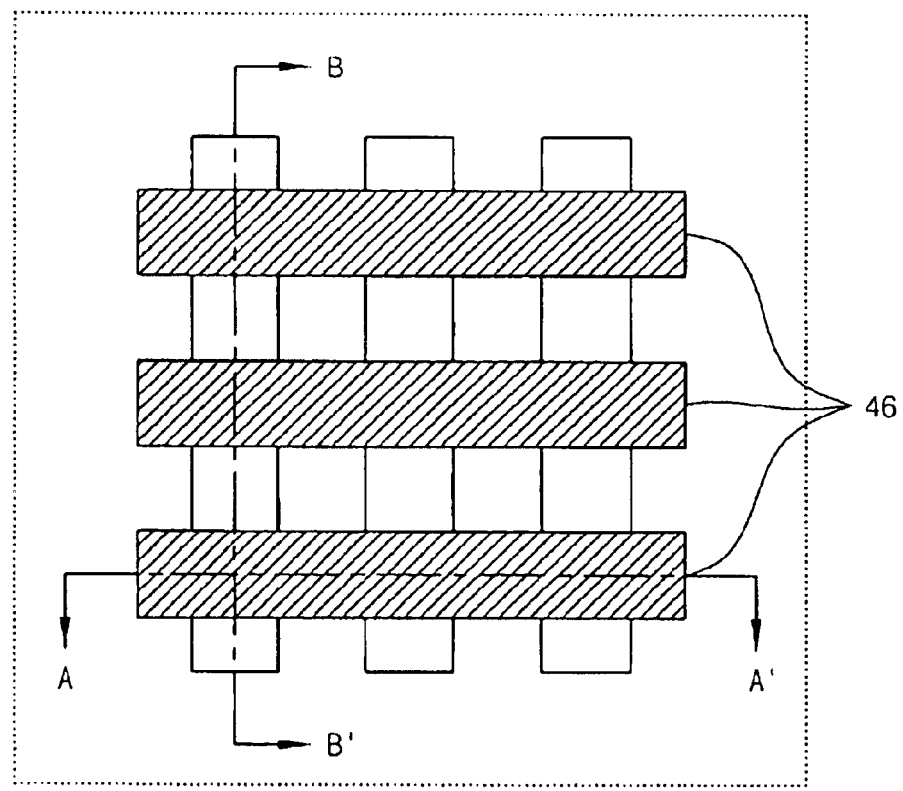
FIG. 4 illustrates, in a top view, a cell array of a conventional SONOS flash memory device.
Figure 5:
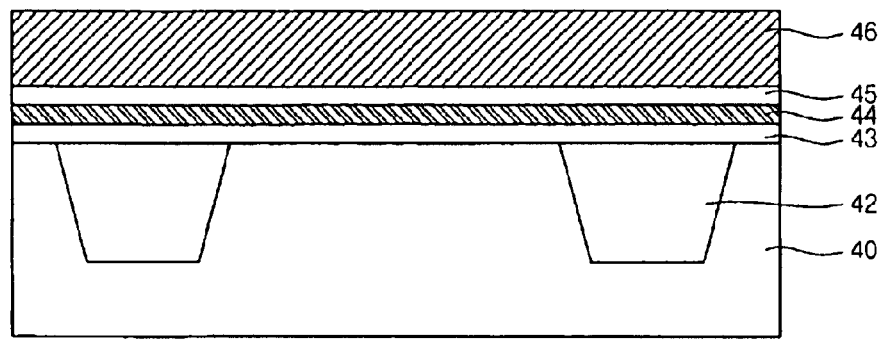
FIG. 5 is a cross-sectional view of FIG. 4 taken along the line A–A'.
Figure 6:
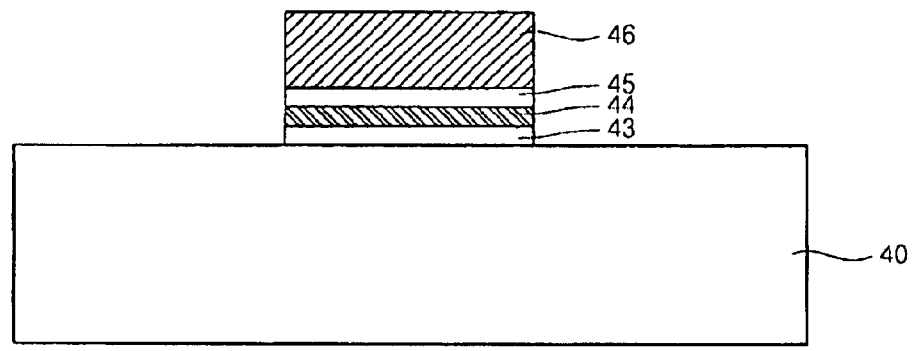
FIG. 6 is a cross-sectional view of FIG. 4 taken along the line B–B'.
Figure 7A:
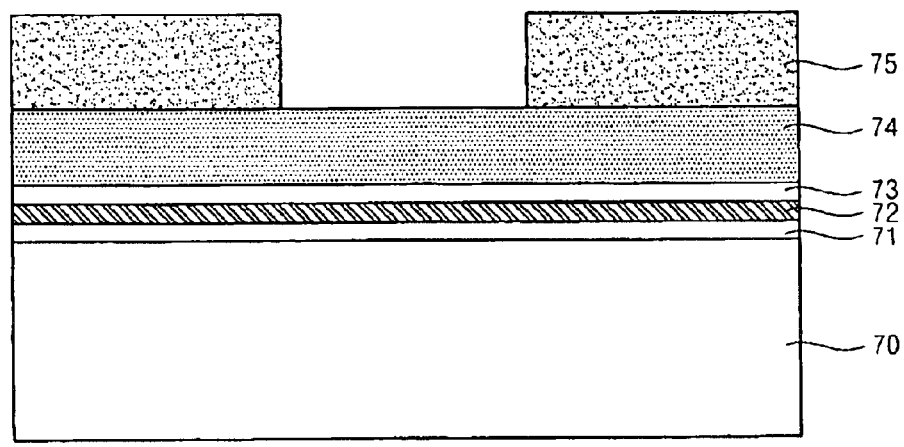
FIGS. 7a through 7f illustrate, in cross-sectional views, the process steps for manufacturing a SONOS flash memory device according to the present invention.

Referring to FIG. 7a, a lower oxide layer 71, a tunnel nitride layer 72, and a sacrificial oxide layer 73 are formed in sequence on a substrate 70 having device isolation layers (not shown). An insulating layer 74 for a hard mask is deposited on the sacrificial layer 73. The insulating layer 74 for a hard mask is preferably oxide or nitride formed using TEOS (tetraethyl orthosilicate) as a source.

Then, a first photoresist pattern 75 is formed on the insulating layer 74. A region for a dual bit cell is exposed by the first photoresist pattern 75. A dry-etching process is performed using the first photoresist pattern 75 as a mask to remove a portion of the insulating layer 74 for a hard mask. As a result, a portion of the sacrificial oxide layer 73 is exposed. The first photoresist pattern 75 is removed.

Figure 7B:
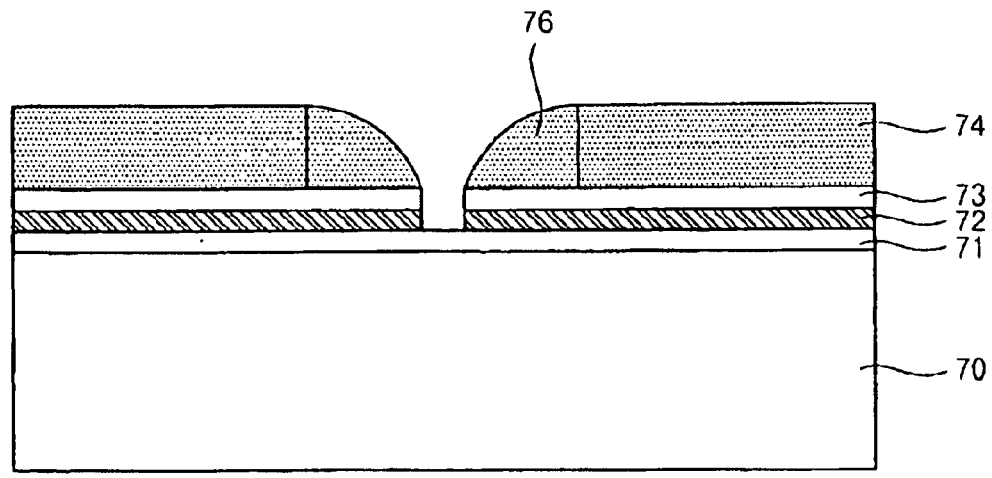

Referring to FIG. 7b, a first insulating layer is deposited on the resulting structure. Then, an etch-back process is performed to form spacers 76 on sidewalls of the insulating layer 74 for a hard mask. The first insulating layer is preferably formed of oxide or nitride using TEOS as a source. The spacers 76 are employed to define smaller area than a minimum area definable by a lithography process.

Then, some part of the sacrificial oxide layer 73 and the tunnel nitride layer 72 are removed through an etching process using the insulating layer 74 and the spacers 76 as a mask. As a result, a portion of the lower oxide layer 71 is exposed and the tunnel nitride layer 72 is separated into two parts. Here, a space between the two parts of the tunnel nitride layer 72, which is defined by the spacers 76, is preferably between 0.020 µm and 0.5 µm. Therefore, a space between the spacers is preferably between 0.020 µm and 0.5 µm.

Figure 7C:
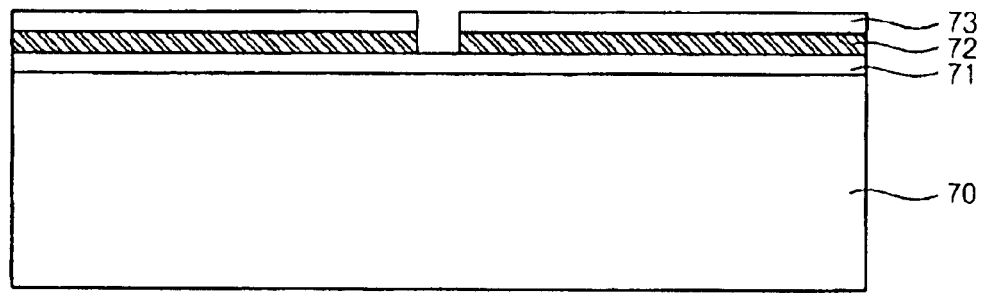

Referring to FIG. 7c, the spacers 76 and the insulating layer 74 for a hard mask are removed by etching.

Figure 7D:
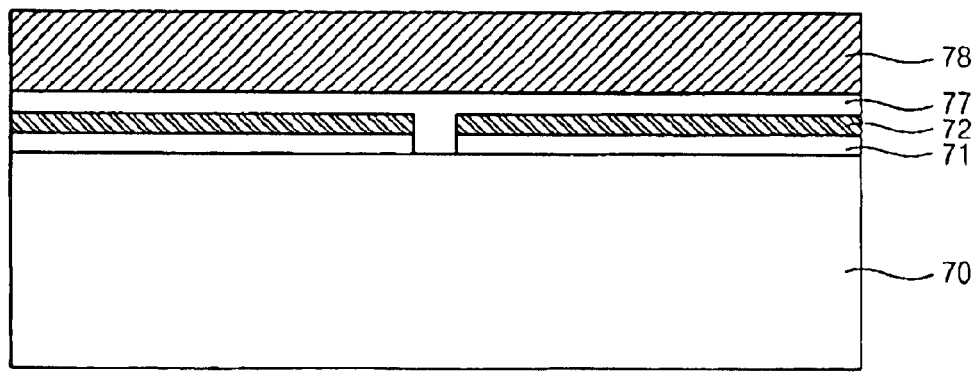

Referring to FIG. 7d, the sacrificial oxide layer 73 is removed by etching. A portion of the lower oxide layer 71 is removed through an etching process using the tunnel nitride layer 72 etched as a mask to expose a portion of the substrate 70. Then, an upper oxide layer 77 is deposited over the tunnel nitride layer 72 and the substrate 70 exposed and a polysilicon layer 78 is deposited over the upper oxide layer 77.

Figure 7E:
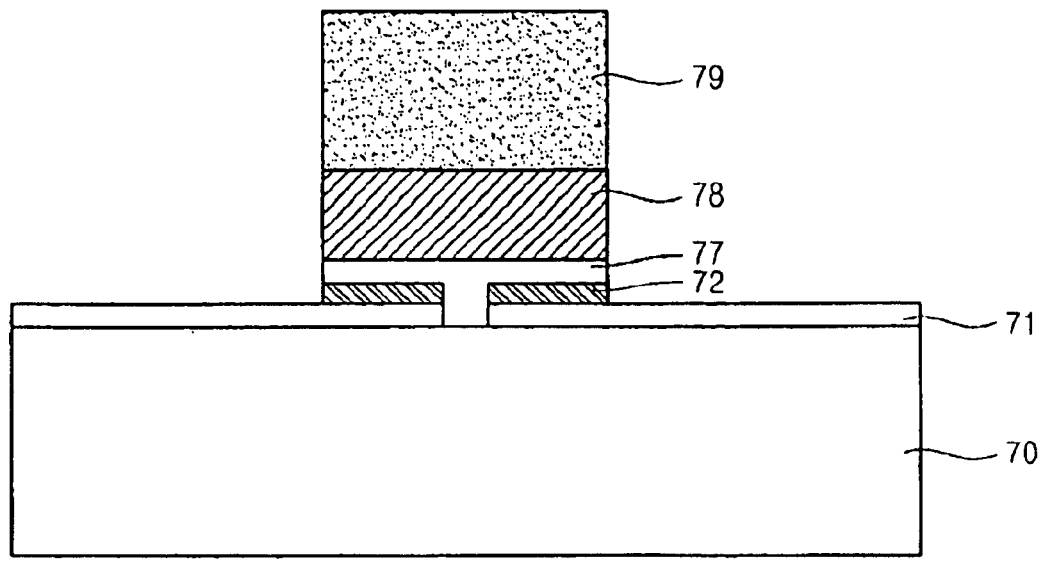

Referring to FIG. 7e, a second photoresist pattern 79 is formed over the polysilicon layer 78. Some parts of the polysilicon layer 78, the upper oxide layer 77, and the tunnel nitride layer 72 are removed through an etching process using the second photoresist pattern 79 as a mask to form a gate 80.

Figure 7F:
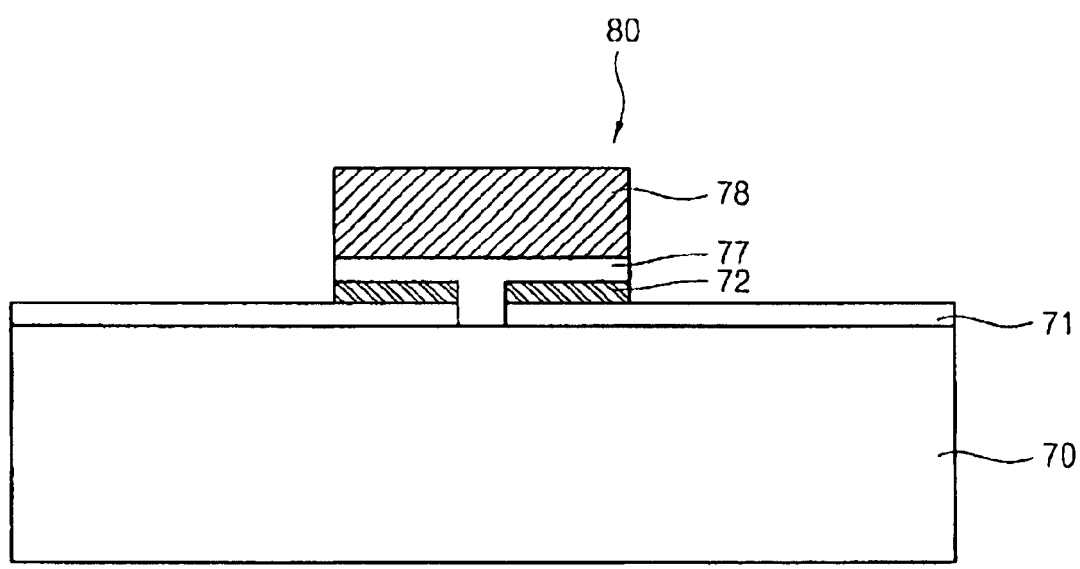

Referring to FIG. 7f, the second photoresist pattern 79 is removed and a source/drain ion implantation process is performed to form a source/drain region in the substrate. As a result, a SONOS flash memory cell having two separate tunnel nitride layer parts is formed.

Accordingly, the present invention can completely prevent movement of electrons captured in the tunnel nitride layer by separating the tunnel nitride layer into two parts and, therefore, obviate device malfunction. The present invention can freely adjust a space between the two tunnel nitride layer parts, thereby reducing cell size. In addition, by separating the tunnel nitride layer into two parts, the present invention can embody a SONOS flash memory device comprising 4 memory cells electrically with the same physical cell size as that of the conventional flash memory.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing a SONOS flash memory device comprising the steps of:
    forming a lower oxide layer, a tunnel nitride layer, a sacrificial oxide layer, and an insulating layer for a hard mask on a semiconductor substrate having device isolation regions;
    removing a portion of the insulating layer for a hard mask by an etching process to expose a portion of the sacrificial oxide layer;
    forming spacers on sidewalls of the insulating layer etched;
    removing some part of the sacrificial oxide layer and the tunnel nitride layer by an etching process using the insulating layer and the spacers as a mask to expose a portion of the lower oxide layer;
    removing the insulating layer, the spacers, and the sacrificial oxide layer;
    removing a portion of the lower oxide layer by an etching process using the tunnel nitride layer etched as a mask to expose a portion of the substrate;

depositing an upper oxide layer and a polysilicon layer in sequence over the resulting structure; and forming a gate having two separate tunnel nitride layer parts by removing some parts of the polysilicon layer, the upper oxide layer, and the tunnel nitride layer in sequence by an etching process.

2. The method as defined by claim 1, wherein the insulating layer for a hard mask is formed of oxide or nitride using tetraethyl orthosilicate (TEOS) as a source.

3. The method as defined by claim 1, wherein the spacers are formed of oxide or nitride using TEOS as a source.

4. The method as defined by claim 1 or claim 3, wherein the spacers are formed so that a space between the spacers is between 0.020 $\mu$m and 0.5 $\mu$m.

5. The method as defined by claim 1, wherein a space between the two separate tunnel nitride layer parts is adjusted with a space between the spacers.

* * * * *